US010749095B2

(12) United States Patent
Ferguson et al.

(10) Patent No.: US 10,749,095 B2
(45) Date of Patent: Aug. 18, 2020

(54) ZZZ COUPLER FOR SUPERCONDUCTING QUBITS

(71) Applicants: David George Ferguson, Takoma Park, MD (US); Anthony Joseph Przybysz, Linthicum, MD (US); Joel D. Strand, Ellicott City, MD (US)

(72) Inventors: David George Ferguson, Takoma Park, MD (US); Anthony Joseph Przybysz, Linthicum, MD (US); Joel D. Strand, Ellicott City, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/690,190

(22) Filed: Nov. 21, 2019

(65) Prior Publication Data
US 2020/0091396 A1    Mar. 19, 2020

Related U.S. Application Data

(62) Division of application No. 16/037,539, filed on Jul. 17, 2018, now Pat. No. 10,546,993, which is a (Continued)

(51) Int. Cl.
*H03K 19/195* (2006.01)
*H01L 39/02* (2006.01)
*G06N 10/00* (2019.01)

(52) U.S. Cl.
CPC .......... *H01L 39/025* (2013.01); *G06N 10/00* (2019.01); *H03K 19/1952* (2013.01)

(58) Field of Classification Search
CPC .......... H01L 39/025; H03K 19/017545; H03K 19/195; H03K 19/1952; H03K 19/0005; H03K 19/18; G06N 99/002; G06N 10/00
See application file for complete search history.

(56) References Cited

U.S. PATENT DOCUMENTS

| 4,800,345 A | 1/1989 | Podell et al. |
| 5,552,735 A | 9/1996 | Kang et al. |

(Continued)

FOREIGN PATENT DOCUMENTS

| EP | 2730029 A2 | 5/2014 |
| EP | 3254375 A1 | 12/2017 |

(Continued)

OTHER PUBLICATIONS

Harris R et al: "Sign- and magnitude-tunable coupler for superconducting flux qubits", arxiv.org, Cornell University Library, 201 Olin Library Cornell University Ithaca, NY 14853, Aug. 11, 2006 (Aug. 11, 2006), XP080248067, DOI: 10.1103/PHYSREVLETT.98. 177001 figure 1.

(Continued)

*Primary Examiner* — Jung Kim
(74) *Attorney, Agent, or Firm* — Tarolli, Sundheim, Covell & Tummino LLP (57) ABSTRACT

Systems and methods are provided for a ZZZ coupler. A first tunable coupler is coupled to the first qubit and tunable via a first control signal. A second tunable coupler is coupled to the first tunable coupler to direct a flux of the first qubit into a tuning loop of the second tunable coupler, such that when a first coupling strength associated with the first tunable coupler is non-zero, a second coupling strength, associated with the second tunable coupler, is a function of a second control signal applied to the second tunable coupler and a state of the first qubit. The second qubit and the third qubit are coupled to one another through the second tunable coupler, such that, when the second coupling strength is non-zero it is energetically favorable for the states of the first and second qubits to assume a specific relationship with respect to the Z-axis.

4 Claims, 5 Drawing Sheets

Related U.S. Application Data division of application No. 15/455,466, filed on Mar. 10, 2017, now Pat. No. 10,074,792.

(56) References Cited

U.S. PATENT DOCUMENTS

| | | | |
|---|---|---|---|
| 5,818,308 | A | 10/1998 | Tanaka et al. |
| 6,346,863 | B2 | 2/2002 | Sasaki et al. |
| 6,407,647 | B1 | 6/2002 | Apel et al. |
| 6,636,126 | B1 | 10/2003 | Pozdeev |
| 6,747,525 | B2 | 6/2004 | Iida et al. |
| 6,765,455 | B1 | 7/2004 | De Lillo |
| 6,806,558 | B2 | 10/2004 | Apel |
| 7,969,178 | B2 | 6/2011 | Przybysz et al. |
| 8,234,103 | B2 | 7/2012 | Biamonte et al. |
| 9,257,736 | B1 | 2/2016 | Josypenko |
| 9,647,662 | B1 | 5/2017 | Abutaleb et al. |
| 9,928,948 | B2 | 3/2018 | Naaman et al. |
| 10,042,805 | B2 | 8/2018 | Naaman et al. |
| 10,229,355 | B2 * | 3/2019 | Ronagh .................... G06N 3/06 |
| 2003/0218516 | A1 | 11/2003 | Gilbert et al. |
| 2004/0189388 | A1 | 9/2004 | Nguyen et al. |
| 2006/0147154 | A1 | 7/2006 | Thom et al. |
| 2006/0220737 | A1 | 10/2006 | Sanderson |
| 2008/0048762 | A1 | 2/2008 | Inamdar et al. |
| 2009/0189712 | A1 | 7/2009 | Jiang |
| 2010/0148853 | A1 | 6/2010 | Harris et al. |
| 2011/0054876 | A1 | 3/2011 | Biamonte et al. |
| 2015/0254571 | A1 | 9/2015 | Miller et al. |
| 2016/0233860 | A1 | 8/2016 | Naaman |
| 2016/0335558 | A1 | 11/2016 | Bunyk et al. |
| 2016/0335560 | A1 | 11/2016 | Mohseni et al. |
| 2017/0127205 | A1 | 5/2017 | Lin |
| 2017/0201224 | A1 | 7/2017 | Strong et al. |
| 2017/0286859 | A1 | 10/2017 | Harris et al. |
| 2018/0032893 | A1 | 2/2018 | Epstein |
| 2019/0007051 | A1 | 1/2019 | Sete et al. |

FOREIGN PATENT DOCUMENTS

| | | |
|---|---|---|
| JP | 2013-058705 A | 3/2013 |
| JP | 5363993 B2 | 12/2013 |
| WO | 98/36467 A1 | 8/1998 |
| WO | 2014028302 A2 | 2/2014 |
| WO | 20160126981 A1 | 8/2016 |
| WO | 2017027733 | 2/2017 |
| WO | 2017062143 A1 | 4/2017 |
| WO | 2017111949 | 6/2017 |
| WO | 2017022806 A1 | 12/2017 |

OTHER PUBLICATIONS

Kang H et al: "Current recycling and SEQ signal transfer in large scale RSFQ circuits", IEEE Transactions on Applied Superconductivity, IEEE Service Enter, Los Alamitos, CA, US; vol. 13, No. 2, Jun. 1, 2003 (Jun. 1, 2003), pp. 547-550, XP011097824, ISSN: 1051-8223, DOI: 10. 1109/TASC.2003.813932 figure 2.

Ehara K et al: "Development of Pulse Transfer Circuits for Serially Biased SFQ Circuits Using the Nb 9-Layer 1-$\mu\hbox{m}$ Process", IEEE Transactions on Applied Superconductivity, IEEE Service Center, Los Alamitos, CA, US, vol. 23, No. 3, Jun. 1, 2013 (Jun. 1, 2013), p. 1300504, XP011513813, ISSN: 1051-8223, DOI: 10. 1109/TASC.2012.2233535 figure 1.

Yu Chen et al: "Qubit Architecture with High Coherence and Fast Tunable Coupling", Physical Review Letters, vol. 113, No. 22, Nov. 26, 2014 (Nov. 26, 2014), XP055403674; US ISSN: 0031-9007, DOI: 10.1103/PhysRevLett.113.220502 figure 1.

International Search Report for International Application No. PCT/US2017/036169 dated Sep. 25.

International Search Report for International Application No. PCT/US2019/012049 dated Dec. 4, 2019.

Worsham A H et al: "A Single Flux Quantum cross-bar switch and demultiplexer" IEEE Transactions on Applied Superconductivity, IEEE Service Center, Los Alamitos, CA, US, vol. 5, No. 2, Jun. 1, 1995 (Jun. 1, 1995), pp. 2996-2999, XP011504599, ISSN: 1051-8223, DOI: 10.1109/77.403222 Section II.; figure 1.

Anonymous: What is the self-resonant frequency of a capacitor?, May 22, 2017, XP055582197,Retrieved from the Internet:URL:https://www.quora.com What-is-the-self-resonant-frequency-of-a-capacitor[retrieved on Apr. 17, 2019] the whole document.

Chancellor et al.: "Circuit design for multi-body interactions in superconducting quantum annealing systems with applications to a scalable architecture". arXiv:1603.09521v3,Mar. 1, 2017 (Mar. 1, 2017)Retrieved from the Internet: URL:https ://arxiv .org/abs/1663. 09521v3 [retrieved on Apr. 26, 2018. Figure 2 and Circuit implementing of multi-body interactions figure 5 and Appendix 2.

Chen et al.: "Qubit Architecture with High Coherence and Fast Tunable Coupling", Physical Review Letters, US, (Nov. 26, 2014), vol. 113, No. 22, doi:10.1103/PhysRevLett.113.220502, ISSN 0031-9007.

Kafri et al.: "Tunable inductive coupling of superconducting qubits in the strongly nonl inear regime", arXiv :1606.08382v2, Jan. 23, 2017 (Jan. 23, 2017), XP055469297,Retrieved from the Internet:URL :https://arxiv .org/abs/1606.08382v2 [retrieved on Apr. 18, 2018],figures 1 and 3; section v.c.

Ehara et al.: "Development of Pulse Transfer Circuits for Serially Biased SFQ Circuits Using the Nb 9-Layer 1um Process", IEEE Transactions on Applied Superconductivity, IEEE Service Center (Jun. 1, 2013), vol. 23, No. 3, p. 1300504.

Ferguson et al.: "Non-stoquastic XX couplers for superconducting flux qubits", Abstract submitted to the APS March Meeti ng 2017 (to be held Mar. 13, 2017),Jan. 4, 2017 (Jan. 4, 2017), XP055469302,Retrieved from the Internet:URL :http ://absimage. aps.org/image/MAR17/MWSMAR17-2016-008291.pdf.[retrieved on Apr. 18, 2018] abstract.

Samach et al.: Coupled qubits for next generation quantum annealing: novel interactions 11, Abstract submitted to the APS March Meeting 2017 (to be held Mar. 13, 2017),Jan. 4, 2017 (Jan. 4, 2017), XP055469301, Retrieved from the Internet: URL:http://absimage. aps.org/image/MAR17/MWS MARI7-2016-003302.pdf [retrieved on Apr. 20, 2018] abstract.

Ghosh et al.,"Quantum simulation of macro and micro quantum phase transition from paramagnetism to frustrated magnetism with a superconducting circuit," New Journal of Physics, vol. 18, No. 3, 0033015, Mar. 7, 2016. Section 2; figures 2 and 3.

Lanting et al.: 11 Cotunneling in pairs of coupled flux qubits, Physical Review B, vol. 82, 060512R,Aug. 23, 2010 (Aug. 23, 2010), XP055469296, figures I(a)&(b).

Lechner et al.: "A quantum annealing architecture with all-to-all connectivity from local interactions", Science Advances, vol. 1, No. 9, EI500838, Oct. 23, 2015 (Oct. 23, 2015), DOI: 10.1126/sciadv. 1500838 figure 4 and corresponding explanations.

Leib et al.: "A transmon quantum annealer: decomposing many-body Ising constraints into pair interactions", Quantum Science and Technology, vol. 1, No. 1, 015008, Dec. 16, 2016 (Dec. 16, 2016), DOI: 10.1088/2058-9565/1/1/015008. Sections 2 and 3.

Lu: "Master Thesis Towards Tunable Coupling Between Two Superconducting Transmission Line Resonators"; Aug. 24, 2012 (Aug. 24, 2012), XP055585125, Retrieved from the Internet:URL:https://www.wmi.badw.de/publications/theses/Xiaoling, Lu Master Thesis 2012.pdf [retrieved on May 2, 2019]; abstract, section 1, section 2, section 3, section 4.

Rafique et al.: Tunable filter based on DC-SQUID chain 1; May 1, 2007 (May 1, 2007), pp. 1-2, XP055585121, DOI: 10.13140/RG. 2.1.1612.5688, Retrieved from the Internet: URL:https://www.researchgate.net/profile/RaihanRafique2/publication/305769905 Tunable filter based on DC SQUID chain/links/57a07d4408ae94f454eb0968/Tunable-filter-based-on-DC-SQUID-chain.pdf [retrieved on May 2, 2019] p. 2.

Robertson et al: "Superconducting device to isolate,entangle, and read out quantum flux states", Mar. 21, 2016, pp. 1-4,ResearchGate Retrieved from the Internet: IRL:https://www.researchgate.net/publication/255276503, Superconducting device to isolate entangle and read out quantum flux states[retrieved on Sep. 27, 2018]abstract; figures 1-4 p. 1, left-hand column, line 1-p. 4,right-hand column, last line.

(56) References Cited

OTHER PUBLICATIONS

Rocchetto et al.: "Stabilizers as a design tool for new forms of the Lechner-Hauke-Zoller annealer",Science Advances, vol. 2 , No. 10, Oct. 21, 2016 (Oct. 21, 2016), pp. e1601246-e1601246,DOI: 10.1126/sciadv.1601246 figure 1 and corresponding explanations p. 5, last paragraph.

Schmitt et al: "Multiplexed readout of transmon qubits with Josephson Bifurcation amplifiers",Physical Review A (Atomic, Molecular, and Optical Physics),vol. 90, No. 6, Dec. 1, 2014 (Dec. 1, 2014), XP055511194, USA ISSN: 1050-2947, DOI: 10.1103/PhysRevA. 90.062333 abstract; figures 1-4 p. 1, Left-hand column, line 1-p. 4,right-hand column, line 25.

Strand et al.: "ZZZ coupler for native embedding of MAX-3SAT problem instances in quantum annealing hardware", Abstract submitted to 2017 APS March Meeti ng (to be held Mar. 13-17, 2017), Jan. 4, 2017 (Jan. 4, 2017), Retrieved from the Internet: URL:http ://absimage .aps.org/image/MAR17/MW S MAR17-2016-001159. pdf [retrieved on Apr. 26, 2018] abstract.

Tuorila et al: "Efficient protocol for qubit initialization with a tunable environment", arxiv.org, Cornell University Library, 201, Olin Library Cornell University Ithaca, NY 14853, Dec. 13, 2016 (Dec. 13, 2016), XP080743892, DOI: 10.1038/S41534-017-0027-1; abstract, figures 1-3, p. 1, line 1-p. 7, last line.

* cited by examiner

ZZZ COUPLER FOR SUPERCONDUCTING QUBITS

RELATED APPLICATIONS

This application claims priority from U.S. patent application Ser. No. 16/037,539, filed 17 Jul. 2018, which claims priority from U.S. patent application Ser. No. 15/455,466, filed 10 Mar. 2017 (now U.S. patent Ser. No. 10/074,792, issued 11 Sep. 2018), both of which are incorporated herein in their entirety.

TECHNICAL FIELD

This invention relates to quantum computing, and more particularly, to a coupler for coupling the Z basis states of three superconducting qubits.

BACKGROUND

A classical computer operates by processing binary bits of information that change state according to the laws of classical physics. These information bits can be modified by using simple logic gates such as AND and OR gates. The binary bits are physically created by a high or a low signal level occurring at the output of the logic gate to represent either a logical one (e.g., high voltage) or a logical zero (e.g., low voltage). A classical algorithm, such as one that multiplies two integers, can be decomposed into a long string of these simple logic gates. Like a classical computer, a quantum computer also has bits and gates. Instead of using logical ones and zeroes, a quantum bit ("qubit") uses quantum mechanics to occupy both possibilities simultaneously. This ability and other uniquely quantum mechanical features enable a quantum computer can solve certain problems exponentially faster than that of a classical computer.

Quantum annealing is an alternate computing methodology that uses quantum effects to solve optimization problems. Quantum annealing operates by initializing qubits into a quantum-mechanical superposition of all possible qubit states, referred to as candidate states, with equal probability amplitudes. This is implemented by applying a strong transverse field Hamiltonian to the qubits. The computer then evolves following the time-dependent Schrödinger equation as the transverse field Hamiltonian is decreased and the problem Hamiltonian is turned on. In some variants of quantum annealing a driver Hamiltonian is applied at intermediate times. During this evolution, the probability amplitudes of all candidate states keep changing, realizing quantum parallelism. If the rates of change of the Hamiltonians are slow enough, the system stays close to the ground state of the instantaneous Hamiltonian. At the end of the evolution the transverse field is off, and the system is expected to have reached a ground or other lower energy state of the problem Hamiltonian, with high probability. The problem Hamiltonian typically encodes the solution of a constraint satisfaction or other optimization problem as the ground state of an associated Ising model. Thus, at the end of the evolution, the quantum annealing computing system generates the solution or an approximate solution to the target optimization problem.

SUMMARY OF THE INVENTION

In accordance with an aspect of the present invention, a ZZZ coupler assembly is provided for coupling first, second, and third qubits. A first tunable coupler is coupled to the first qubit and tunable via a first control signal. A second tunable coupler is coupled to the first tunable coupler to direct a flux of the first qubit into a tuning loop of the second tunable coupler, such that when a first coupling strength associated with the first tunable coupler is non-zero, a second coupling strength, associated with the second tunable coupler, is a function of a second control signal applied to the second tunable coupler and a state of the first qubit. The second qubit and the third qubit are coupled to one another through the second tunable coupler, such that, when the second coupling strength is non-zero, it is energetically favorable for the states of the first and second qubits to assume a specific relationship with respect to the Z-axis.

In accordance with another aspect of the present invention, a method is provides a ZZZ coupling among three qubits. A first qubit of the three qubits is coupled to a second qubit of the three qubits via a first tunable coupler utilizing galvanic Josephson mutual inductance. The second qubit is coupled to a third qubit of the three qubits via a second tunable coupler utilizing galvanic Josephson mutual inductance. The third qubit is coupled to the first qubit via a third tunable coupler utilizing galvanic Josephson mutual inductance. The first qubit is coupled to the second tunable coupler via a fourth tunable coupler such that a flux from the first qubit is directed into a tuning loop of the second tunable coupler. The second qubit is coupled to the third tunable coupler via a fifth tunable coupler such that a flux from the second qubit is directed into a tuning loop of the third tunable coupler. The third qubit is coupled to the first tunable coupler via a sixth tunable coupler such that a flux from the third qubit is directed into a tuning loop of the first tunable coupler.

In accordance with yet another aspect of the present invention, a quantum circuit assembly includes a first qubit, a second qubit, a third qubit, and a first tunable coupler coupled to the first qubit. A second tunable coupler is coupled to the first tunable coupler such that a flux of the first qubit is directed into the second tunable coupler. The second qubit and the third qubit are coupled to one another through the second tunable coupler via galvanic Josephson mutual inductance.

DETAILED DESCRIPTION

The ZZZ coupler described herein is intended for use in a quantum computing environment, in which information is stored and manipulated in superconducting qubits. A physical implementation of a qubit can be a Josephson junction, a quantum dot, a SQUID (superconducting quantum interference device), a Cooper pair box, or an ion trap. Further, unless specified, the coupling of two elements may be accomplished according to the invention using any of various means of physical coupling, for example, a mechanical coupling by means of an electrical conductor, capacitive coupling, inductive coupling, magnetic coupling, nuclear coupling, and optical coupling, or any combination of the foregoing. As used herein, a "classical control" indicates a device that behaves generally according to the laws of classical physics that provides a control signal to a quantum element, such as a qubit or coupler.

The systems and methods herein provide arbitrary coupling among three superconducting qubits, as well as any pair of the three qubits, along a Z-basis. A ZZ coupling between two qubits makes it energetically favorable for the states of the first and second qubits to assume a specific relationship with respect to the Z-axis of the Bloch sphere, both pointing either in the +Z direction or both in the −Z direction. Similarly, a ZZZ coupling among three qubits makes it energetically favorable for the states of all three qubits to align in the same direction along the Z-axis, all pointing either in the +Z direction or all pointing in the −Z direction. Each axis corresponds to a specific quantum state defined on the Bloch sphere of the qubit. It will be appreciated that the coupling can be positive or negative, with a negative ZZ coupling making it energetically favorable for the states of the first and second qubits to align in the same direction along the Z-axis, both pointing either in the +Z direction or both in the −Z direction. A positive ZZ coupling, denoted as +ZZ, making it energetically favorable for the states of the first and second qubits to align in different directions along the Z-axis.

Most particle interactions found in nature are two body in character. When three body terms exist, they tend to be weak in comparison to two body interactions. This disclosure describes a device that solves both of these challenges generating a strong, tunable, three body ZZZ interactions between flux qubits, as well as independently tunable two body ZZ interactions, including the case where two body interactions are zero. Specifically, the inventors have designed a circuit utilizing a novel coupling method that generates a three qubit interaction by modulating the strength of a qubit-qubit interaction based on the state of a third qubit. In one implementation, compatible with high coherence flux qubits, the circuit utilizes an inventive galvanic Josephson coupling between qubits where Josephson junctions provide the mutual inductance.

Figure 1:
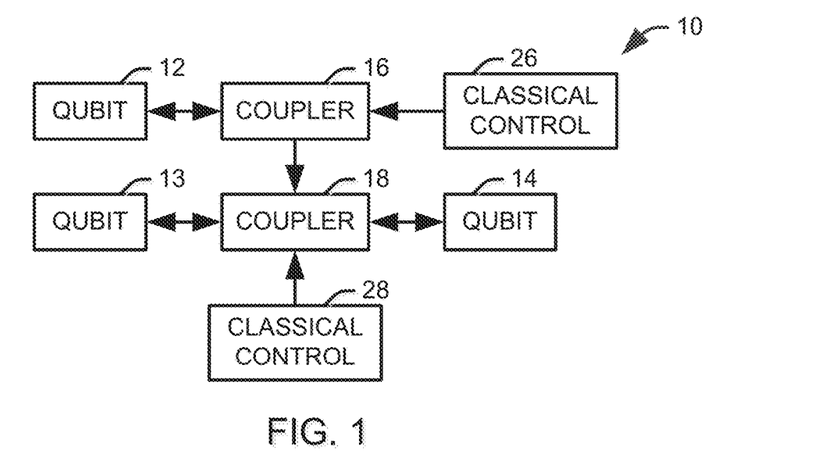
FIG. 1 illustrates one example of a system comprising three coupled superconducting qubits.

FIG. 1 illustrates one example of a system 10 comprising three coupled superconducting qubits 12-14. The system includes a first coupler 16 that couples a first qubit 12 to a second coupler 18, such that a flux produced by the first qubit is directed into a tuning loop of the second coupler. The first coupler 16 can be selected to be tunable, such a coupling strength and sign (e.g., positive or negative) can be tuned via a control signal provided by a first classical control 26. It will be appreciated that the control signal can be selected such that the coupling strength of the first coupler 16 is zero, and thus no flux from the first qubit is directed to the second coupler 18. In one implementation, the first coupler 16 is a split junction tunable coupler, and the interaction strength between qubits is controlled by an amount of tuning flux, provided by the first classical control 26, that threads the tunable junction.

The second coupler 18 couples the second qubit 13 to the third qubit 14. Like the first coupler 16, the second coupler 18 can be selected to be tunable, such that a coupling strength and sign can be tuned via a control signal provided by a second classical control 28. Accordingly, when the first coupler 16 is tuned to provide a non-zero coupling, a coupling strength of the second coupler 18 is a function of the control signal provided by the second classical control 28 and the state of the first qubit 12. In one implementation, the second coupler 18 is a split junction tunable coupler, and the interaction strength between qubits is controlled by an amount of tuning flux, provided by the second classical control 28, that threads the tunable junction, as well as an amount of flux from the first qubit 12 directed into the second coupler by the first coupler 16.

In one implementation, the second qubit 13 and the third qubit 14 are coupled through the second coupler 18, with each qubit coupled to the second coupler via a galvanic Josephson mutual inductance. Optimizing the strength of ZZZ coupling is important for successful device operation since the energy scale of the coupling often needs to be greater than other energies or frequencies in the problem such as the energy associated with the achievable base temperature of the experiment. Further, it is helpful for the coupler to be compatible with highly coherent flux qubits which typically utilize junctions with small critical current to minimize dephasing from flux noise. The high coherence facilitates quantum effects. The small critical current limit places important restrictions on inductive elements that are part of qubit-qubit tunable couplers. These constraints are derived from the relationship between junction critical current, $I_C$, and the effective Josephson inductance of a junction $L_J = \Phi_0/2\pi I_C$, where $\Phi_0/2\pi \sim 330$ nA nH.

For instance, for an $I_C \sim 50$ nA junction, the Josephson inductance is ~6.6 nH. To generate a strong coupling via inductive coupling, the mutual inductance between coupled qubits should be a significant fraction of this value. Often mutual inductances, including all geometric mutuals, are generated with linear inductances. To understand the challenges involved with generating such a large inductance with linear inductors, consider that to generate an $L_J \sim 6.6$ nH inductance with a $Z=50$ Ohm metal trace and propagation speed v~c/3, where c is the speed of light in a vacuum, requires a trace length $L_J v/Z$ which is longer than one centimeter. This presents a technical challenge since geometric couplers would need to be quite large relative to the rest of the circuit, and stray capacitance could limit achievable inductance at relevant frequencies. The inventors have found that the use of galvanic coupling overcomes many of these challenges.

Figure 2:
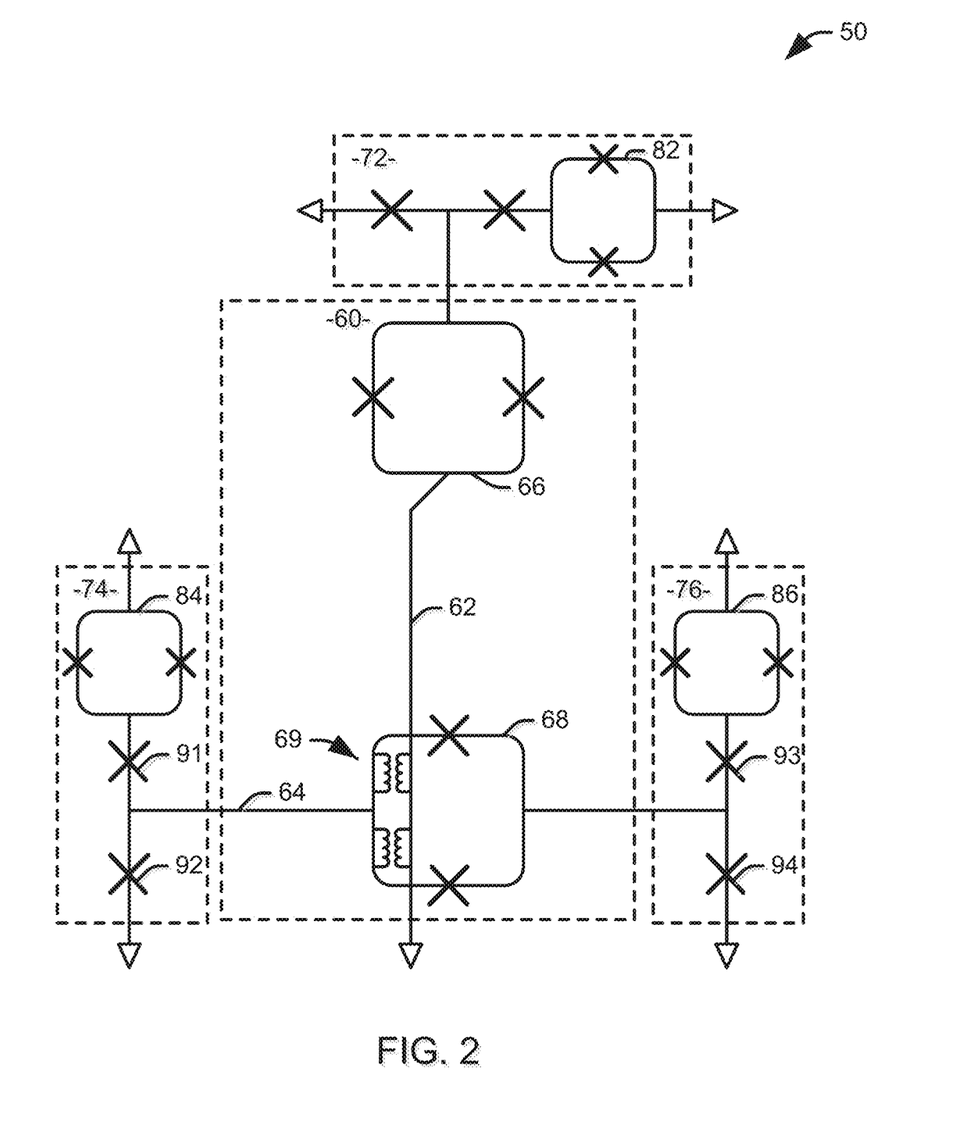
FIG. 2 illustrates one example of quantum circuit employing a ZZZ coupler assembly to couple a first qubit, a second qubit, and a third qubit in accordance with an aspect of the present invention.

FIG. 2 illustrates one example of quantum circuit 50 employing a ZZZ coupler assembly 60 to couple a first qubit 72, a second qubit 74, and a third qubit 76 in accordance with an aspect of the present invention. The coupler assembly 60 includes a first tunable coupler 62, including a first tuning loop 66, and a second tunable coupler 64, including a second tuning loop 68. In the illustrated implementation, each of the first and second tuning loops 66 and 68 are compound Josephson junctions, formed as superconducting loops interrupted by two Josephson junctions. The first tunable coupler 62 directs flux from the first qubit 72 into the second tunable coupler 64. The second tunable coupler 64 couples the second qubit 74 to the third qubit 76 in the Z basis, with each qubit 74 and 76 coupled to the second tunable coupler via a galvanic Josephson mutual inductance. Accordingly, when a coupling strength of the second tunable coupler is non-zero, it is energetically favorable for the states of the first and second qubits to assume a specific relationship with respect to the Z-axis. In the illustrated implementation, the flux from the first qubit 72 is provided inductively through at least one pair of inductive elements 69 bridging the first tunable coupler 62 and the tuning loop 68 of the second tunable coupler 64.

In the illustrated implementation, each of the first qubit 72, the second qubit 74, and the third qubit 76 are implemented as four junction flux qubits, with first and second junctions of each qubit 72, 74, and 76 forming a compound junction 82, 84, and 86 for biasing the flux qubits. A third and fourth junction 91-94 complete the flux qubit loops, with junctions 92 and 94 forming the galvanic Josephson mutual inductance shared by qubits 74 and 76, respectively, with the tunable coupler 68. A flux qubit, in general terms, is a superconducting loop interrupted by some number of Josephson junctions. While a biasing element is not illustrated in the simplified example of FIG. 2, in general operation, a flux qubit is biased by a flux, generally described in units of the superconducting flux quantum $\Phi_0$. When the applied bias flux in loops 82, 84, or 86 is near one flux quantum and for suitable device parameters, the potential energy of the system exhibits two minima, one corresponding to clockwise and the other to counterclockwise current flow in the superconducting loop. The two possible directions of current flow represent the lowest energy quantum states of the system. While it is also possible to have a single potential well even at a flux quantum of bias flux, the double-well regime described here highlights the unique capability of the inventive coupler to function even with energetically degenerate states. It will be appreciated that the coupling assembly 60 can also be used for generating three body inductive coupling between Transmon qubits. In this case the strength of three body interaction term is reduced due to the lower RMS current compared to the static currents in the flux regime.

The inductive potential of the full circuit can be modelled, with suitable generalization for mutual inductances, using $-\Phi_0 I_C/2\pi \cos\theta$ for each junction and $(1/2L)(\Phi_0/2\pi)^2 \theta^2$ for each inductor, where $\theta$ is the gauge invariant phase across the circuit element. When the flux qubits are tuned to the harmonic oscillator, or single well, regime, the potential shows a single minimum. When the flux qubits are tuned to the flux, or double well, regime, and all the couplings are off, the potential shows eight degenerate minimums corresponding to the eight qubit states. The energy of each minimum can be given a label $U_{abc}$ where, a represents a state of the first qubit 72, b represents a state of the second qubit 74, and c represents a state of the third qubit 76, such that $U_{010}$ is the minimum energy of the well corresponding to the qubit state 010. Tuning either coupler 62 or 64, to a non-zero coupling strength adjusts the energy of each minimum. For a Hamiltonian of the form $H/h=-g_{123}ZZZ$ the value of $g_{123}$, determines the ZZZ coupling energy. Here, h is Plank's constant, which relates coupling energies and coupling frequencies. When the qubits are in the flux regime the value of $g_{123}$ can be calculated as $\Sigma_{abc}z(a)z(b)z(c)U_{abc}/8$ where $z(0)=1$ and $z\Phi=-1$. The ZZ energy between the second qubit 74 and the third qubit 76 can be calculated as $\Sigma_{abc}z(b)z(c)U_{abc}/8$. This method accurately determines the energy scales of the lowest eigenstates of the corresponding quantum Hamiltonian as long the control fluxes stay within an MRT (macroscopic resonant tunneling) spacing, that is, as long as the difference in energy between potential wells stays below the local harmonic energy of each well. This depends on the qubit's shunt capacitance in addition to the inductive potential.

By utilizing compound Josephson junction coupling techniques, the coupler assembly 60 does not bias individual qubits, that is, no single qubit Z terms are generated in the Hamiltonian of the system by the assembly. This invention can be configured to utilize multiple operating points by altering a first applied flux, $\Phi_1$, provided to the first tuning loop 66, and a second applied flux, $\Phi_2$, provided to the second tuning loop 68. These fluxes can be adjusted to separately control the ZZ coupling provided by the second tunable coupler 64 as well as the ZZZ coupling provided by the assembly 60 through the first tunable coupler 62. For example, the fluxes can be provided such that both the ZZ and ZZZ couplings are inactive. In this instance, example values for the two applied fluxes could include $(\Phi_1,\Phi_2)=(0.5,0.5)\Phi_0$. To activate the ZZ coupling, with an arbitrary sign, without the ZZZ coupling, values of $(\Phi_1,\Phi_2)=(0.5, 0.5\pm 0.5)\Phi_0$ could be used. It will be appreciated that the value of the second applied flux will vary across the range given depending on a desired strength and sign of the coupling. When the flux is provided to avoid the ZZZ coupling, a Hamiltonian of the system would not include a ZZZ term. To activate the ZZZ coupling, with an arbitrary sign, without the ZZ coupling, the applied flux values could include $(\Phi_1,\Phi_2)=(0, +0.5)\Phi_0$. In this case, a Hamiltonian of the system would not contain a term representing the ZZ coupling between the second qubit 74 and the third qubit 76, although it would contain a term representing the ZZZ coupling. Finally, to provide ZZ coupling and ZZZ coupling, values including $(\Phi_1,\Phi_2)=(0, \pm 0.5\pm 0.2)\Phi_0$ can be used.

Figure 3:
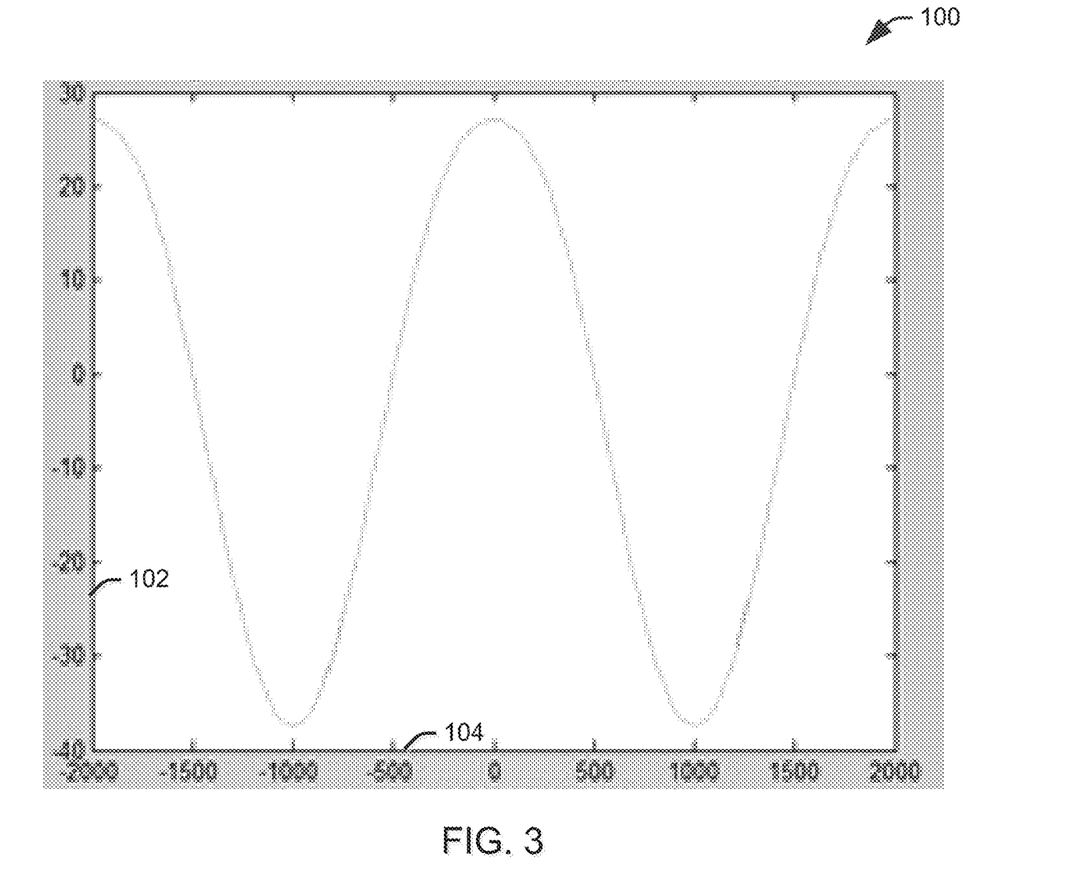
FIG. 3 is a chart illustrating, for the circuit of FIG. 2, a strength of a ZZ coupling between the second and third qubits provided by the second tunable coupler, represented in gigahertz, as a function of the flux applied to the tuning circuit, represented in thousandths of the flux quantum $(m\Phi_0)$.

FIG. 3 is a chart 100 illustrating, for the circuit of FIG. 2, a strength of a ZZ coupling between the second and third qubits 74 and 76 provided by the second tunable coupler 64, represented in gigahertz, as a function of the flux applied to the tuning circuit 68, represented in thousandths of the flux quantum ($m\Phi_0$). In this example, it is assumed that the Josephson junctions in the compound junctions 82, 84, and 86 of the flux qubits 72, 74, and 76 have critical currents of thirty-five nanoamps, the other Josephson junctions in the qubits have critical currents of seventy nanoamps, and the junctions in the two couplers 62 and 64 have critical currents of twenty-five nanoamps. The inductive elements 62 each have an inductance of one hundred and fifty picohenry, with the efficiency of the mutual inductance being 0.5. The coupling strength is represented on the vertical axis 102, while the applied flux is represented on the horizontal axis 104. As can be seen from the chart 100, the coupling strength is at a minimum when the applied flux is near $(1000*n+500)m\Phi_0$, where n is an integer. A maximum positive coupling is achieved when the applied flux is near $2000n$ $m\Phi_0$, and a maximum negative coupling is achieved when the applied flux is near $(2000n+1000)$ $m\Phi_0$. Values between these extremes can be selected to tune the coupling strength to a desired magnitude and sign. One of ordinary skill in the art will recognize that fabrication variation of the critical currents will slightly alter the flux values where zero couplings occur.

Figure 4:
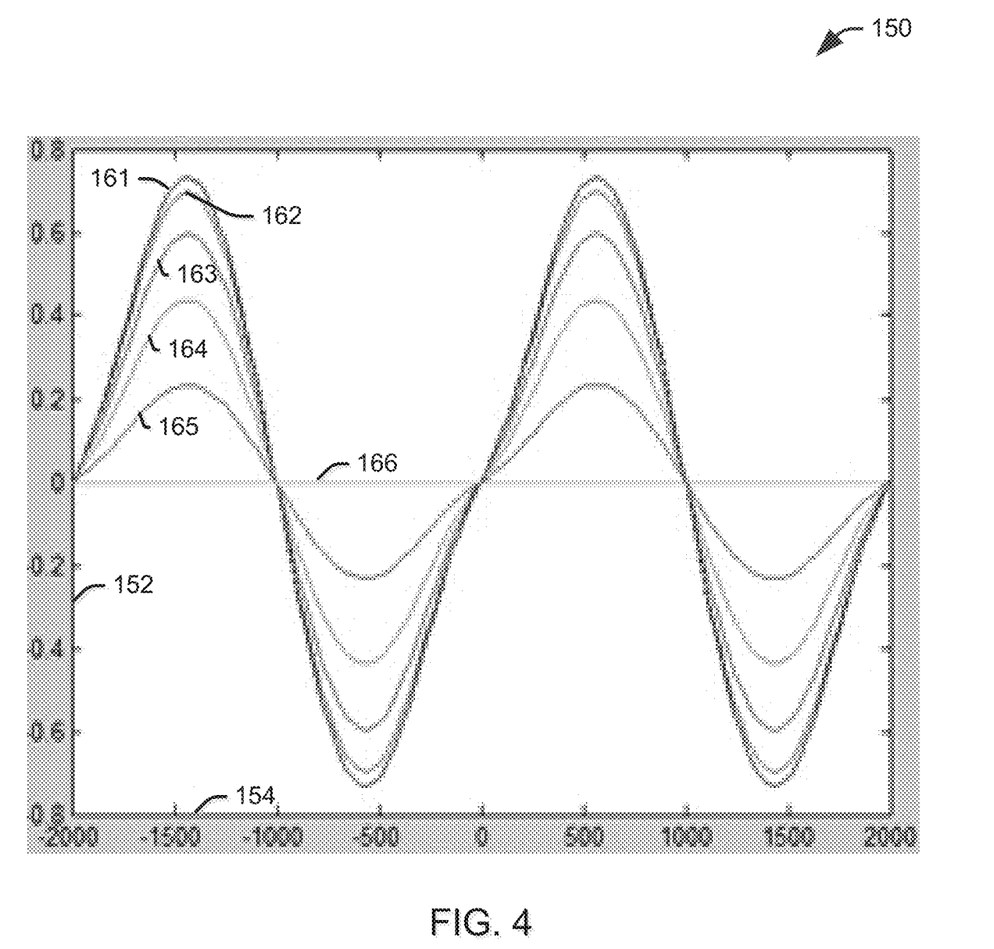
FIG. 4 is a chart illustrating, for the circuit of FIG. 2, a strength of a ZZZ coupling among the first, second, and third qubits provided by the coupler assembly, represented in gigahertz, as a function of the first applied flux and the second applied flux, represented in thousandths of the flux quantum $(m\Phi_0)$.

FIG. 4 is a chart 150 illustrating, for the circuit of FIG. 2, a strength of a ZZZ coupling among the first, second, and third qubits 72, 74, and 76 provided by the coupler assembly 60, represented in gigahertz, as a function of the first applied flux and the second applied flux, represented in thousandths of the flux quantum ($m\Phi_0$). In this chart, the parameters for the circuit, such as the bias to the qubits 72, 74, and 76 and the critical currents of the various Josephson junctions, are selected such that the ZZ coupling energy is independent of the first applied flux. As with FIG. 3, it is assumed in this example that the Josephson junctions in the compound junctions 82, 84, and 86 of the flux qubits 72, 74, and 76 have critical currents of thirty-five nanoamps, the other Josephson junctions in the qubits have critical currents of seventy nanoamps, and the junctions in the two couplers 62 and 64 have critical currents of twenty-five nanoamps. The inductive elements 62 each have an inductance of one hundred and fifty picohenry, with the efficiency of the mutual inductance being 0.5. The coupling strength is represented on the vertical axis 152, while the second applied flux is represented on the horizontal axis 154.

The value of the first applied flux is represented by the individual plots 161-171, with each plot representing the ZZZ coupling strength for a different value of the first applied flux. A first plot 161 represents the ZZZ coupling strength when the first applied flux is zero. A second plot 162 represents the ZZZ coupling strength when the first applied flux is equal to one-tenth of the flux quantum. A third plot 163 represents the ZZZ coupling strength when the first applied flux is equal to one-fifth of the flux quantum. A fourth plot 164 represents the ZZZ coupling strength when the first applied flux is equal to three-tenths of the flux quantum. A fifth plot 165 represents the ZZZ coupling strength when the first applied flux is equal to two-fifths of the flux quantum. A sixth plot 166 represents the ZZZ coupling strength when the first applied flux is equal to one-half of the flux quantum. As can be seen from the chart 150, when the first applied flux is equal to one-half of the flux quantum, no ZZZ coupling is present, regardless of the value of the second applied flux. Further, it will be appreciated that the magnitude and sign of the ZZZ coupling can be selected by tuning the values for the first and second applied flux.

A seventh plot 167 represents the ZZZ coupling strength when the first applied flux is equal to three-fifths of the flux quantum. An eighth plot 168 represents the ZZZ coupling strength when the first applied flux is equal to seven-tenths of the flux quantum. A ninth plot 169 represents the ZZZ coupling strength when the first applied flux is equal to four-fifths of the flux quantum. A tenth plot 170 represents the ZZZ coupling strength when the first applied flux is equal to nine-tenths of the flux quantum. An eleventh plot 171 represents the ZZZ coupling strength when the first applied flux is equal to the flux quantum. It will be appreciated that this provides a maximum value for the ZZZ coupling strength.

Figure 5:
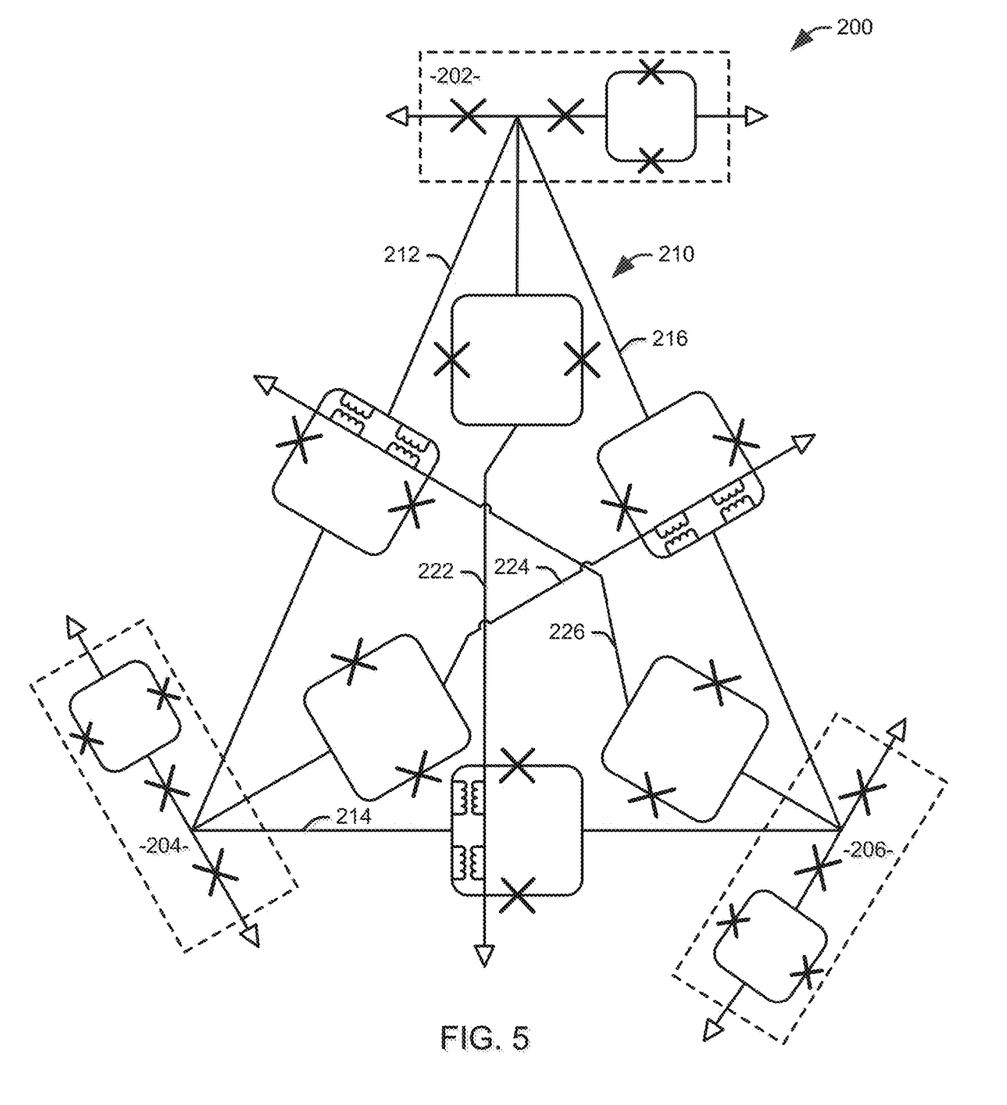
FIG. 5 illustrates one example of quantum circuit comprising three qubits coupled via a galvanic coupler assembly that allows for arbitrary ZZZ and pairwise ZZ couplings.

FIG. 5 illustrates one example of quantum circuit 200 comprising three qubits 202, 204, and 206 coupled via a galvanic coupler assembly 210 that allows for arbitrary pairwise couplings. Compared to the circuit of FIG. 2, the illustrated circuit 200 increases the ZZZ coupling energy by a factor of three and symmetrizes the design for robustness. In the circuit, the first qubit 202 and the second qubit 204 are coupled via a galvanic Josephson mutual inductance through a first tunable coupler 212, the second qubit and the third qubit 206 are coupled via a galvanic Josephson mutual inductance through a second tunable coupler 214, and the first qubit and the third qubit are coupled via a galvanic Josephson mutual inductance through a third tunable coupler 216. For the purpose of this example, each of the first tunable coupler 212, the second tunable coupler 214, and the third tunable coupler 216 can be assumed to be substantially equivalent in structure and function to the second tunable coupler 64 of FIG. 2.

Each of the first, second, and third qubits 202, 204, and 206 are also coupled, respectively, to the second tunable coupler 212, the third tunable coupler 216, and the first tunable coupler 212 such that flux from the qubits is directed into a tuning loop of their respective coupler to facilitate the ZZZ interactions among the qubits. Specifically, the first qubit 202 is coupled to the second tunable coupler 214 through a fourth tunable coupler 222, the second qubit 204 is coupled to the third tunable coupler 216 through a fifth tunable coupler 224, and the third qubit 206 is coupled to the first tunable coupler 212 through the sixth tunable coupler 226. For the purpose of this example, each of the fourth tunable coupler 222, the fifth tunable coupler 224, and the sixth tunable coupler 226 can be assumed to be substantially equivalent in structure and function to the first tunable coupler 62 of FIG. 2.

The illustrated galvanic coupler 210 allows high coherence, low critical current flux qubits to be coupled with a ZZZ coupling strength that can be ten times larger than the energy scale set by the base temperature of commercial dilution refrigerators, which is currently ~10 $k_B$ mK, where kB is Boltzmann's constant, even with ZZ coupling strength tuned to zero. ZZZ couplings are helpful for natively generating exclusive or Boolean satisfiability (XOR-3SAT) problem Hamiltonians for quantum annealers, for generating coupling Hamiltonians for primitive controlled-controlled-phase gates, implementing Hamiltonian operators needed for building encoded qubits from physical qubits, and implementing logical operations on distance three encoded qubits. These couplings need to be large compared to the device temperature in annealing and encoding applications, and larger than ~h/GateTime for gate or logical applications where the operations need to occur in GateTime or faster, where h is Plank's constant. To take advantage of quantum effects the coupling scheme needs to be compatible with high coherence, low critical current flux qubits.

The coupler of the present invention can generate arbitrary two and three body terms, allowing the circuit to encode the more general three satisfiability problem (3SAT) problems. 3SAT is the canonical NP-complete constraint satisfaction problem. To see that the circuit 200 is sufficient to natively encode local 3SAT instances, consider first a single three bit clause function $f(a, b, c)$ that takes the value 1 when the clause is true and 0 when the clause is false. If one now considers a set of clause functions $\{f_i\}$ that comprise a MAX3SAT instance, then finding the variables that maximizes the number of satisfied clauses is equivalent to minimizing the cost function $-\Sigma_i f_i$. Now consider the three qubit operator $F=\Sigma_{abc} f(a, b, c)|abc\rangle\langle abc|$ derived from the clause function $f$. Since the operator is diagonal in the Z-basis it can be decomposed as $F=g_0 III+g_1 ZII+g_2 IZI+g_3 IIZ+g_{12} ZZI+g_{13} ZIZ+g_{23} IZZ+g_{123} ZZZ$, where Z is the Pauli Z operator and/the identity. After including necessary controls for single qubit bias fields, the circuit 200 can simultaneously generate all required couplings to implement the cost function operator $-\Sigma_i F_i$ and thus can natively encode the local 3SAT instance. Finding the global minimum of the cost function not only solves the associated satifiability problem, but the more general problem of finding the maximum number of satisfiable clauses (MAX-SAT). The locality constraint reduces the number 3SAT instances that can be natively solved using the present invention, however, MAX-XOR-3SAT remains NP-hard even when restricted to local (bounded-degree) planer hypergraphs. Given sufficient precision of the bias fields, the circuit can natively encode more general weighted MAX-3SAT constraint satisfaction problems.

Figure 6:
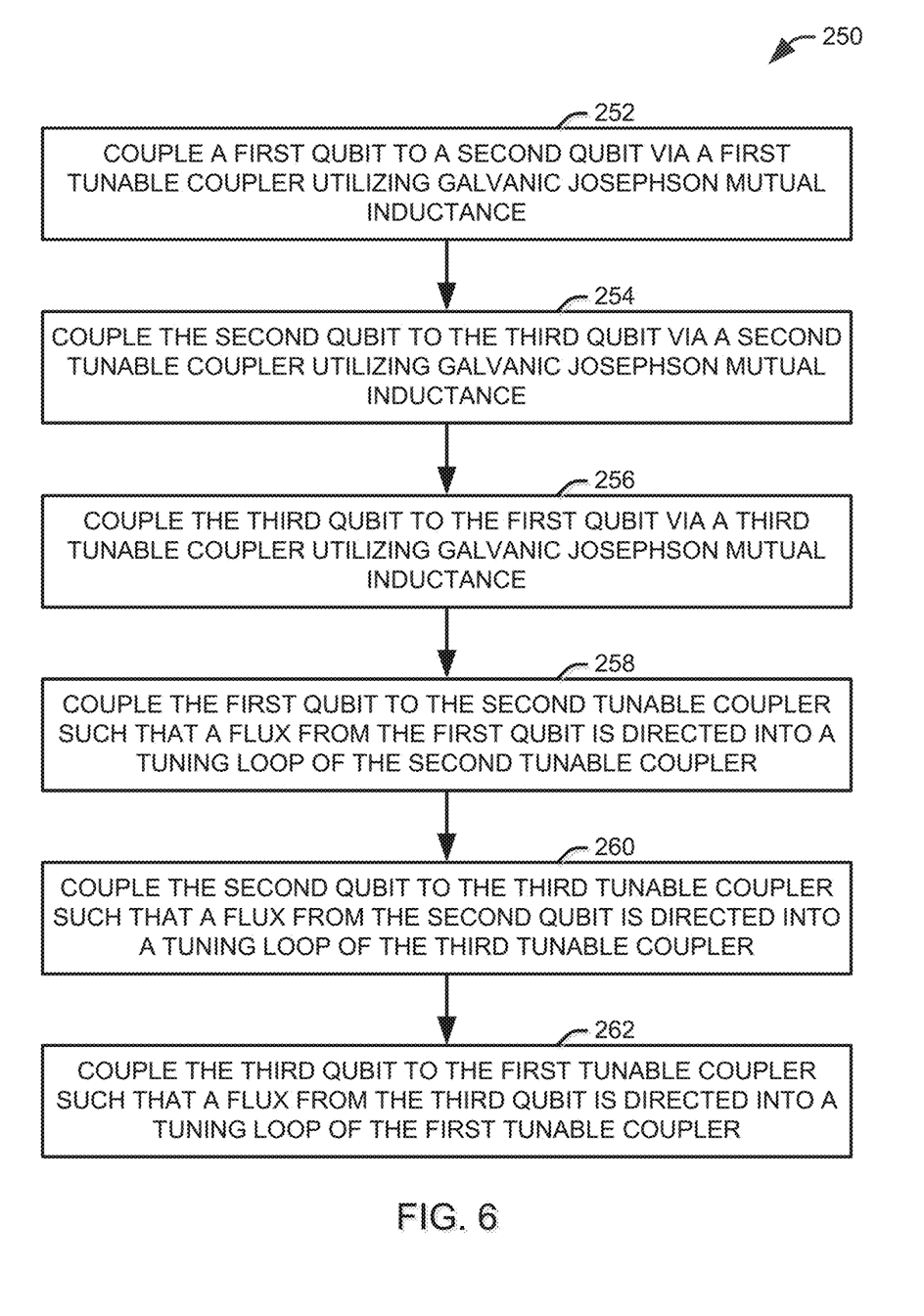
FIG. 6 illustrates one method for providing a ZZZ coupling among three qubits.

In view of the foregoing structural and functional features described above in FIGS. 1-5, an example method will be better appreciated with reference to FIG. 6. While, for purposes of simplicity of explanation, the method of FIG. 6 is shown and described as executing serially, it is to be understood and appreciated that the present invention is not limited by the illustrated order, as some actions could in other examples occur in different orders and/or concurrently from that shown and described herein.

FIG. 6 illustrates one method 250 for providing a ZZZ coupling among three qubits. At 252, a first qubit of the three qubits is coupled to a second qubit of the three qubits via a first tunable coupler utilizing galvanic Josephson mutual inductance. It will be appreciated that the first tunable coupler can share one or more Josephson junctions with the first and second qubits to facilitate the galvanic coupling. At 254, the second qubit is coupled to a third qubit of the three qubits via a second tunable coupler utilizing galvanic Josephson mutual inductance. At 256, the third qubit is coupled to the first qubit via a third tunable coupler utilizing galvanic Josephson mutual inductance.

At 258, the first qubit is coupled to the second tunable coupler via a fourth tunable coupler such that a flux from the first qubit is directed into a tuning loop of the second tunable coupler. Accordingly, a state of the first qubit can influence the coupling strength of the second tunable coupler. At 260, the second qubit is coupled to the third tunable coupler via a fifth tunable coupler such that a flux from the second qubit is directed into a tuning loop of the third tunable coupler. At 262, the third qubit is coupled to the first tunable coupler via a sixth tunable coupler such that a flux from the third qubit is directed into a tuning loop of the first tunable coupler. The resulting circuit allows for ZZZ coupling among the circuits having a sign and coupling strength tunable via control signals provided to the tunable couplers, as well as arbitrary ZZ couplings among the three qubits.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the scope of the appended claims.

What is claimed is:

1. A method for providing a ZZZ coupling among three qubits, comprising:

coupling a first qubit of the three qubits to a second qubit of the three qubits via a first tunable coupler utilizing galvanic Josephson mutual inductance;

coupling the second qubit to a third qubit of the three qubits via a second tunable coupler utilizing galvanic Josephson mutual inductance;

coupling the third qubit to the first qubit via a third tunable coupler utilizing galvanic Josephson mutual inductance;

coupling the first qubit to the second tunable coupler via a fourth tunable coupler such that a flux from the first qubit is directed into a tuning loop of the second tunable coupler;

coupling the second qubit to the third tunable coupler via a fifth tunable coupler such that a flux from the second qubit is directed into a tuning loop of the third tunable coupler; and coupling the third qubit to the first tunable coupler via a sixth tunable coupler such that a flux from the third qubit is directed into a tuning loop of the first tunable coupler.

2. The method of claim 1, further comprising:

tuning a first coupling strength associated with the first tunable coupler via a first control signal; and tuning a second coupling strength associated with the second tunable coupler via a second control signal, wherein each of the first qubit, the first tunable coupler, and the second tunable coupler are configured such that when the first coupling strength is non-zero, a second coupling strength is a function of the second control signal and a state of the first qubit, and when the first coupling strength is zero, the second coupling strength is independent of the state of the first qubit.

3. The method of claim 2, wherein the first coupler and the second coupler comprise respective first and second compound Josephson junctions, tuning the first coupling strength comprises providing a first control flux to the first compound Josephson junction and tuning the second coupling strength comprises providing a second control flux to the first compound Josephson junction.

4. The method of claim 2, wherein the second control signal can be varied such that the second coupler can provide any of a negative coupling, such that it is energetically favorable for the states of the second and third qubits to align in a same direction along the Z-axis, a positive coupling, such that it is energetically favorable for the states of the second and third qubits to align in opposite directions along the Z-axis, and a zero coupling between the second qubit and the third qubit.

\* \* \* \* \*